(12) United States Patent
Zhu et al.

(10) Patent No.: US 9,820,401 B2
(45) Date of Patent: Nov. 14, 2017

(54) PACKAGED RF POWER TRANSISTOR DEVICE HAVING NEXT TO EACH OTHER A GROUND AND A VIDEO LEAD FOR CONNECTING A DECOUPLING CAPACITOR, RF POWER AMPLIFIER

(71) Applicant: Ampleon Netherlands B.V., Nijmegen (NL)

(72) Inventors: Yi Zhu, Leiden (NL); Josephus van der Zanden, Best (NL)

(73) Assignee: Ampleon Netherlands B.V., Nijmegen (NL)

(*) Notice: Subject to any disclaimer, the term of this patent is extended or adjusted under 35 U.S.C. 154(b) by 181 days.

(21) Appl. No.: 14/527,138

(22) Filed: Oct. 29, 2014

(65) Prior Publication Data

US 2015/0156910 A1 Jun. 4, 2015

(30) Foreign Application Priority Data

Nov. 29, 2013 (EP) .................................. 13195160

(51) Int. Cl.
*H05K 7/14* (2006.01)
*H03F 1/56* (2006.01)
(Continued)

(52) U.S. Cl.
CPC ............... *H05K 7/14* (2013.01); *H01L 23/66* (2013.01); *H03F 1/56* (2013.01); *H03F 3/189* (2013.01);
(Continued)

(58) Field of Classification Search
CPC .. H05K 7/14; H01L 23/66; H03F 1/56; H03F 3/189; H03F 3/245
(Continued)

(56) References Cited

U.S. PATENT DOCUMENTS 6,734,728 B1 5/2004 Leighton et al.
2006/0076673 A1 4/2006 Miyaji et al.
(Continued)

FOREIGN PATENT DOCUMENTS

EP 1 748 487 A2 1/2007
WO 01/56083 A2 8/2001
WO 03/063246 A2 7/2003

OTHER PUBLICATIONS

Extended European Search Report for Application No. 13195160.0 (dated Mar. 24, 2014).

*Primary Examiner* — Eric Thomas
*Assistant Examiner* — Michael P McFadden
(74) *Attorney, Agent, or Firm* — McDonnell Boehnen Hulbert & Berghoff LLP

(57) ABSTRACT

A packaged Radio Frequency power transistor device is described, which comprises a component carrier a die comprising a semiconductor transistor having a source, a gate and a drain, wherein the die is mounted at the component carrier, a ground connection being electrically connected to the source, an output lead being electrically connected to the drain, a resonance circuit being electrically inserted between the output lead and the ground connection, and a video lead being electrically connected to the resonance circuit. The video lead is configured for being connected to a first contact of a decoupling capacitor. The ground connection is configured for being connected to a second contact of the decoupling capacitor. It is further described a RF power amplifier comprising such a packaged Radio Frequency power transistor device.

19 Claims, 6 Drawing Sheets

(51) Int. Cl.
*H01L 23/66* (2006.01)
*H03F 3/189* (2006.01)
*H03F 3/24* (2006.01)

(52) U.S. Cl.
CPC ........ *H03F 3/245* (2013.01); *H01L 2223/665* (2013.01); *H01L 2223/6644* (2013.01); *H01L 2924/0002* (2013.01); *H03F 2200/222* (2013.01); *H03F 2200/387* (2013.01)

(58) Field of Classification Search
USPC ........................................................ 361/763
See application file for complete search history.

(56) References Cited

U.S. PATENT DOCUMENTS

| | | | |
|---|---|---|---|
| 2007/0024374 A1* | 2/2007 | Blair | H01L 23/66 330/302 |
| 2008/0231373 A1* | 9/2008 | Rahman | H01L 23/66 330/302 |
| 2012/0146723 A1 | 6/2012 | Blednov et al. | |
| 2012/0154053 A1* | 6/2012 | Blair | H01L 23/66 330/278 |
| 2012/0286878 A1* | 11/2012 | Dening | H01L 23/66 330/296 |
| 2014/0210557 A1* | 7/2014 | Bouny | H03F 1/0205 330/296 |

* cited by examiner

PACKAGED RF POWER TRANSISTOR DEVICE HAVING NEXT TO EACH OTHER A GROUND AND A VIDEO LEAD FOR CONNECTING A DECOUPLING CAPACITOR, RF POWER AMPLIFIER

CROSS-REFERENCE TO RELATED APPLICATIONS

This application claims the priority under 35 U.S.C. §119 of European patent application no. 13195160.0, filed on Nov. 29, 2014, the contents of which are incorporated by reference herein.

FIELD OF THE INVENTION

The present invention relates to the technical field of semiconductor devices being used in power amplifiers. In particular, the present invention relates to a packaged Radio Frequency power transistor device having a certain lead configuration and to a Radio Frequency power amplifier comprising such a packaged Radio Frequency power transistor device.

BACKGROUND OF THE INVENTION

Radio Frequency (RF) power amplifiers (PA) are widely used in particular in wireless communication applications such as e.g. cellular network radio base station amplifiers. With the recent growth in the demand for wireless services, the operating frequency for wireless networks and, as a consequence also for RF PA, has increased dramatically and is now in excess of 2 GHz.

At the high frequencies such RF PA must operate, impedance matching and biasing of the active elements is an important factor for an efficient operation of the RF PA. The input and output circuits used to match power transistors to external devices are typically implemented with a combination of bondwire inductance, in-package capacitors, stripline or microstrip structures on a printed circuit board, and discrete capacitors.

Modern RF power amplifiers typically use RF power transistor devices. Such devices include a semiconductor die being encapsulated in a package which comprises several terminal leads. Such terminal leads include an RF output lead via which the generated RF power is outputted. Further, a so called video lead may be used for connecting a resonance circuit embedded in a package of the RF power transistor device with an external decoupling capacitor. Such an external decoupling capacitor is used for adjusting the video-band resonance frequency of the resonance circuit. The resonance circuit may be used for compensating at least partially parasitic inductances and capacitances with the semiconductor die and the surrounding package.

For connecting this resonance circuit with the external decoupling capacitor one or more bondwires may be used for carrying a so called forward current from the resonance circuit to the video lead. Further, there is provided a current path coursing (a) through ground vias to a backside of a printed circuit board (PCB), (b) over the backside of the PCB, and (c) via a grounded metal block and/or via a grounded flange of the RF power transistor device. This provided current path carries a so called ground return current.

In known packages for RF power transistor devices (a) the current path for the ground return current is quite long and (b) the spatial separation between the forward current flowing though at least one bondwire and the ground return current is quite large. Both given facts (a) and (b) result in an increase of the parasitic inductance of packaged RF power transistor devices. As a consequence, the performance of a packaged RF power transistor device is deteriorated.

U.S. Pat. No. 6,734,728 B1 discloses a broadband RF PA which uses a RF power transistor device with separate terminals for the injection of gate bias and drain bias direct current DC sources. Thereby, the need for ¼ wavelength transmission lines is eliminated and the freed up space can be employed for a higher density packaging. The disclosed RF power transistor device can be implemented with a single die circuit or multiple die circuits operating in parallel.

US 2012/0146723 A1 discloses a high power RF amplifier having output impedance matching networks. Such a high power RF amplifier includes an active semiconductor device mounted on a substrate within a device package. The disclosed RF amplifier has an output impedance matching network comprising a high pass network provided at least partly on the active semiconductor device and a low pass network having a first inductive shunt connection between an output of the active semiconductor device and a first output lead and a second inductive shunt connection between the output of the active semiconductor device and a second output lead. A part of the second output lead forms an inductance contributing to the inductance of the low pass network.

There may be a need for providing a package for a RF power transistor device which yields a high performance of the RF power transistor device within a wide frequency range.

OBJECT AND SUMMARY OF THE INVENTION

This need may be met by the subject matter according to the independent claims. Advantageous embodiments of the present invention are described by the dependent claims.

According to a first aspect of the invention there is provided a packaged Radio Frequency (RF) power transistor device which can be used in particular in a power amplifier (PA) operating in the frequency range from DC up to 3 GHz. The described packaged RF power transistor device comprises (a) a component carrier, (b) a die comprising a semiconductor transistor having a source, a gate and a drain, wherein the die is mounted at the component carrier, (c) a ground connection being electrically connected to the source, (d) an output lead being electrically connected to the drain, (e) a resonance circuit being electrically inserted between the drain and the ground connection, and (f) a video lead being electrically connected to the resonance circuit. The video lead is configured for being connected to a first contact of a decoupling capacitor and the ground connection is configured for being connected to a second contact of the decoupling capacitor. In accordance with the described RF power transistor device, with respect to a reference plane being spanned by a bottom surface of the component carrier, the output lead and the video lead are arranged at least approximately at the same height level.

The described packaged RF power transistor device is based on the idea that by contrast to known package designs for RF power transistor devices a spatial separation between (a) the path of a so called ground return current flowing from the first contact of the decoupling capacitor to the die and (b) the path of a so called forward current flowing from the die to the second contact of the decoupling capacitor can be kept small. As a consequence, also the parasitic inductance of the described packaged RF power transistor device will be small and the described packaged RF power transistor device will be characterized by a high performance within a wide frequency range.

Furthermore, due to the close proximity between the video lead and the ground connection within the described packaged RF power transistor device a low impedance at the drain of the die may be realized. This results in the matter of fact that voltage ripples of a modulated high power output signal being provided at the drain of the die will be small in the video band. This may provide the advantage that the described packaged RF power transistor device will exhibit a very good signal modulation bandwidth. In this respect it is mentioned that since the above mentioned die comprises an electronically active component (i.e. the semiconductor transistor), this die may also be called an active die.

The electrical connection between the die and the video lead may be accomplished by means of one or more bond wires.

The resonance circuit may be any electric assembly within the package of the described packaged RF power transistor device, which comprises an inductance and a capacitance. Thereby, the inductance and/or the capacitance (a) may be realized with physically existing inductive and/or capacitive components and/or (b) may be given by a parasitic inductance and/or a parasitic capacitance. In this context a parasitic inductance may be caused in particular by at least one thin bond wire. Further, a parasitic capacitance may be caused in particular by a parasitic drain-source capacitance given within the die with the semiconductor transistor. Specifically, the resonance circuit may be realized respectively given by a series connection between a physically existing (tuning) inductance and a physically existing blocking capacitor, which is conductive only for High Frequency (HF) signals. Thereby, the effect of the physically existing capacitance and in particular the effect of the physically existing inductance can be combined with the effects of a parasitic capacitance and/or a parasitic inductance given within the package of the described packaged RF power transistor device.

The decoupling capacitor may be used for changing and in particular for lowering the video resonance frequency of the resonance circuit.

Descriptive speaking, the idea which provides the packaged RF power transistor device is to create a ground return current path which is located spatially close to the forward current path.

It is mentioned that the video lead may be configured for being connected to a first contact of a further decoupling capacitor and the ground connection may be configured for being connected to a second contact of the further decoupling capacitor. This may provide the advantage that more than one decoupling capacitors can be installed such that the overall capacitance of the decoupling capacitance can be easily increased.

According to an embodiment of the invention the component carrier comprises (a) a flange providing a support for the die, and (b) a metal block providing a support for the flange. With this special configuration of the component carrier a good heat transmission away from the semiconductor die can be realized. This holds in particular if not only the metal block but also the flange is made from a material showing a good heat conductivity.

According to a further embodiment of the invention the semiconductor transistor being comprised within the die is a Metal Oxide Semiconductor device. Preferably, the Metal Oxide Semiconductor (MOS) device is a so called Laterally Diffused Metal Oxide Semiconductor (LDMOS) device. This may provide the advantage that the described packaged RF power transistor device can be realized with the currently dominant electronic device technology used in high-power RF PA applications.

According to a further embodiment of the invention (a) the ground connection is a ground lead and (b) the ground lead and the video lead are spatially arranged next to each other. Specifically the ground lead, the video lead and the output lead are arranged at least approximately at the same height level above the reference plane being spanned by the bottom surface of the component carrier. This may provide the advantage that all leads which are mentioned above are arranged at the same height level. As a consequence, contacting the described packaged RF power transistor device for instance with receiving terminals being provided in a rack of a RF PA can accomplished in an easy and reliable manner.

Since the described package is used in particular in the RF frequency range, the output lead may also be denominated a RF lead.

By contrast to a design, wherein the ground contact for the semiconductor transistor is realized via a conductor path extending between the back side of the die and the component carrier, according to this embodiment an additional ground lead is provided at least closely to the upper side or the top side of the package of the packaged RF power transistor device. With this configuration the video lead and the ground lead can be spatially arranged close to each other. Further, the length of the current path for the ground return current can be shortened effectively. Specifically, the length of the current path for the ground return current flowing from the first contact of the decoupling capacitor to the die may be at least approximately the same as the length as the current path for the forward current flowing from the die to the second contact of the decoupling capacitor.

In other words, with the design of the described RF power transistor device package (a) the length of the current path for the ground return current can be kept particularly short and/or (b) the spatial separation between the path of the forward current and the path of the ground return current can be kept particularly small. As a consequence, also the parasitic inductance of the described packaged RF power transistor device can be further reduced and the described packaged RF power transistor device will be characterized by a particularly high performance within a wide frequency range.

The electrical connection also between the ground lead and the die may be accomplished by means of one or more bond wires.

A ground reference with respect to the video lead may be defined on the nearby ground connection in addition or instead of on the backside of the package of the packaged RF power transistor device respectively the backside of a PCB to which the packaged RF power transistor device is mounted. With the same concept, ground bondwires can provide a ground reference with respect to the video lead bondwire as well. The loop area enclosed by the forward current and the ground return current can be significantly reduced. Further, by contrast to known designs the path for the ground return current is well defined and shortened.

According to a further embodiment of the invention the packaged RF power transistor device further comprises a further ground lead, wherein the video lead is arranged in between the ground lead and the further ground lead. In particular, the video lead may be arranged at least approximately in the middle between the ground lead and the further ground lead. Thereby, a symmetric spatial configuration of the leads of the described packaged RF power transistor device can be realized.

Descriptive speaking, by using two ground leads sandwiching the video lead in between a so called "ground-signal-ground (G-S-G)" configuration will be realized and the overall parasitic inductance of the lead configuration can be further reduced. As has already been mentioned above, in that case voltage ripples of a modulated high power output signal being provided at the drain of the (active) die will be small. This has the positive effect that the described packaged RF power transistor device will exhibit a very good signal modulation bandwidth.

In this respect it is mentioned that if the video lead is arranged in between the ground lead and the further ground lead it should be clear that also the further ground lead may be arranged at the same height level above the backside of the component carrier as the ground lead, the video lead and, if applicable, the output lead.

According to a further embodiment of the invention the RF power transistor device further comprises a further video lead, wherein the ground lead is arranged between the video lead and the further video lead.

In particular, the ground lead may be arranged at least approximately in the middle between the video lead and the further video lead. Also according to this embodiment a symmetric spatial configuration of the leads of the described packaged RF power transistor device can be realized.

According to a further embodiment of the invention the RF power transistor device further comprises (a) an additional ground lead being electrically connected to the ground lead, and (b) an additional video lead being electrically connected to the video lead. This means that the described RF power transistor device comprises at least two video leads. Thereby, with respect to a first lateral side of the package of the RF power transistor device at which first lateral side the ground lead and the video lead are lead through the package to the outside of the package the additional ground lead and the additional video lead are arranged at a second lateral side of the package, wherein the second lateral side is opposite to the first lateral side.

The described configuration, where ground and video leads are not only provided at one lateral side of the package but also at another opposite lateral side of the package, may provide the advantage that the packaged RF power transistor device can be contacted in various or variegated manners. Further, the described RF power transistor device can be realized in a highly symmetric manner.

Providing the additional ground lead and the additional video lead may further provide the advantage that a further decoupling capacitor can be connected between these two additional leads. Therefore, different combinations of decoupling capacitors can be used to adapt or to change the resonance frequency of the resonance circuit in an appropriate manner. This increases the flexibility of the packaged RF power transistor device when being used in a RF PA.

In case of the above described lead configuration wherein the video lead is located in the middle between the ground lead and the further ground lead (sandwich configuration) an additional further ground lead may be provided. In accordance with the lead configuration at the first lateral side of the package the additional further ground lead may be a part of a sandwich configuration wherein the additional video lead is located in between the additional ground lead and the additional further ground lead.

According to a further embodiment of the invention the additional ground lead and/or the additional video lead are arranged at least approximately at the same height level as the video lead respectively as the ground lead. This may provide the advantage that all leads which are mentioned above are arranged at the same height level. As a consequence, a contacting of the described packaged RF power transistor device is facilitated.

In this respect it is mentioned that of course also the additional further ground lead may be provided at the same height level.

According to a further embodiment of the invention the die comprises (a) an active semiconductor die, and (b) a passive die. Thereby, the active semiconductor die and the passive die are spatially separated from each other.

The active semiconductor die may comprise or may include the semiconductor transistor, which can be seen as the "heart" of the described packaged RF power transistor device. The above mentioned resonance circuit may be attached to or included in the active semiconductor die. However, preferably at least a part of the resonance circuit may be attached to or included in the passive die. This holds in particular for a capacitance of the resonance circuit. An inductance of the resonance circuit may preferably be realized by means of an appropriate bond wire.

The passive die, which according to its denomination comprises no active electronic components, may further be used to provide in an easy and reliable manner an electric contact between the active semiconductor die and the bondwires connecting the passive die with the (additional) ground lead and the (additional) video lead. On the passive die there may further be formed one or more metal tracks or conductor paths. By choosing a proper geometry of the metal tracks or conductor paths the impedance of the metal tracks or conductor paths can be adjusted properly. This means that the above mentioned inductance of the resonance circuit, which can be realized at least partially by means of such metal tracks or conductor paths, can be finely adjusted by choosing a proper geometry of the metal tracks or conductor paths.

Generally speaking, passive electric or electronic structures (e.g. transmission line, capacitor, etc.) being formed on the middle die can help to further optimize the video bandwidth performance of the described packaged RF power transistor device.

In this respect it is mentioned that the passive die can realized by means of any suitable technology. Specifically, the passive die can be a semiconductor die, a laminate or a Low Temperature Cofired Ceramics (LTCC) die. It is pointed out that these examples are only exemplary and of course other technologies for realizing passive dies can be used.

According to a further embodiment of the invention the packaged RF power transistor device further comprises a further active semiconductor die comprising a further power transistor device having a further source, a further gate and a further drain, wherein the further active semiconductor die is mounted at the component carrier. This means that the described packaged RF power transistor device comprises two different semiconductor transistors. In a RF PA these two different semiconductor transistors, which can be arranged in a spatially compact manner, can be used for one and the same amplifier stage or for different amplifier stages.

According to a further embodiment of the invention the passive die is located in between the active semiconductor die and the further active semiconductor die. In this further embodiment the passive die, which is preferably located in the middle between the two active semiconductor dies, acts as a "manifolds".

According to a further embodiment of the invention (a) the active semiconductor die is electrically connected to the video lead by means of at least a first bondwire and (b) the further active semiconductor die is electrically connected to the video lead by means of a second bondwire. This may provide the advantage that one video lead can be used for two power transistor devices, i.e. the above mentioned power transistor device and the above mentioned further power transistor device.

In a configuration where only one ground lead is present (i.e. the above mentioned further ground lead is missing), the ground lead may be electrically connected by means of a third bondwire to the active semiconductor die and by means of a fourth bondwire to the further active semiconductor die.

In a configuration with two ground leads (i.e. the above mentioned ground lead and the above mentioned further ground lead) the ground lead may be connected by means of a third bondwire to the active semiconductor die and the further ground lead may be connected by means of a fourth bondwire to the further active semiconductor die. Thereby, a crossing of bondwires can be avoided.

According to a further aspect of the invention there is provided a Radio Frequency power amplifier comprising (a) a printed circuit board, and (b) a packaged RF power transistor device as described above, wherein the packaged Radio Frequency power transistor device is mounted at the printed circuit board.

The described RF power amplifier is based on the idea that the above elucidated packaged RF power transistor device can be employed in an easy manner in order to obtain an RF amplifier which is characterized by a high performance within a wide frequency range. As has already been mentioned above, as a direct technical consequence of (a) a reduced length of the current path for the ground return current and/or (b) a small spatial separation between the path of the forward current and the path of the ground return current, a low impedance at the output lead can be realized. This has the beneficial effect that voltage ripples of a modulated high power output signal being provided at the drain of the (active) die will be small. As a further consequence, the described RF PA will exhibit a very good signal modulation bandwidth.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DESCRIPTION OF EMBODIMENTS

Figure 1:
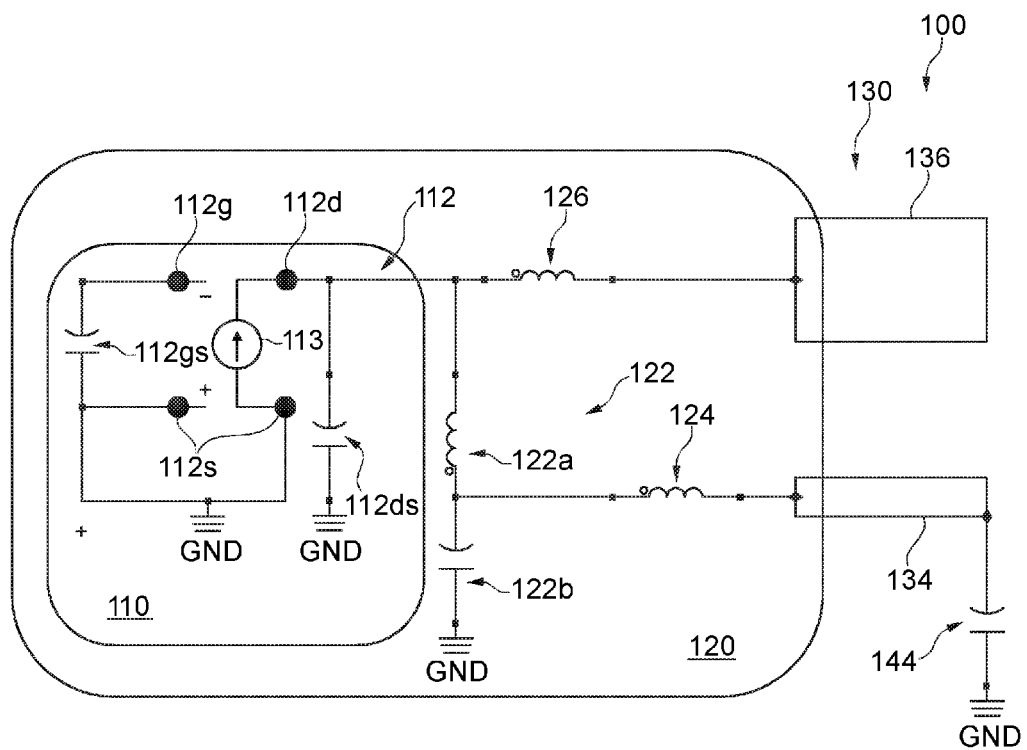
FIG. 1 shows a circuit diagram of a packaged RF power transistor device in accordance with an embodiment of the invention.

The illustration in the drawing is schematically. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment are not elucidated again at a later position of the description.

FIG. 1 shows a circuit diagram of a packaged RF power transistor device 100 in accordance with an embodiment of the invention. The packaged RF power transistor device 100 comprises a die 110 being arranged within a package 120. A lead configuration 130 comprising an RF output lead 136 and a video lead 134 leads through a housing of the package 120 to the outside. It is mentioned that at least one lead, which connects the packaged RF power transistor device to ground, is not depicted in FIG. 1.

The die 110 includes a semiconductor transistor 112, which comprises a source 112s, a gate 112g and a drain 112d. Also not physically existent as a real passive components the parasitic drain-source capacitance 112ds and the parasitic gate-source capacitance 112gs are illustrated in FIG. 1. External to the die 110 but within the package 120 there is formed a resonance circuit 122 made from two physically existent components, a (tuning) inductor 122a and a (tuning) capacitor 122b. In FIG. 1 there are further depicted parasitic inductances of a bondwire 124 respectively 126 connecting the drain 112d to the RF output lead 136 and the "center" of the resonance circuit 122 to the video lead. External to the package 120 there is connected a so called video band decoupling capacitor 144, which, as has already been described above, lowers the resonance frequency of the resonance circuit 122. A lowering of this resonance frequency typically results in a better predistortability when using a pre-distorter.

In this respect it is pointed out that the parasitic drain-source capacitance 112ds can be seen as a part of the resonance circuit 122. Therefore, also the parasitic drain-source capacitance 112ds has an influence on the resonance frequency of the resonance frequency of the resonance circuit 122.

According to the embodiment described here, the (tuning) capacitor 122b has a capacitance of approximately 200 pF and the resonance frequency of the resonance circuit 122 is in the range of 200 to 400 MHz. For operating the packaged RF power transistor device 100 a signal may be applied to the gate 112g, which has a carrier frequency of approximately 2 GHz and which is modulated by a modulation frequency of approximately 40 to 80 MHz. Due to non-linear effects a fifths harmonic of approximately 200 to 400

MHz of the modulation frequency will be generated, which corresponds at least approximately to the resonance frequency of the resonance circuit 122.

It is further mentioned that the parasitic inductances 124 and 126 of the bondwires should be quite low. Otherwise the video band decoupling capacitor 144 will not be effective and the video bandwidth of the whole packaged RF power transistor device 100 will be limited.

It is furthermore mentioned that due to the depicted circuitry surrounding and electrically connecting the semiconductor transistor 112, the semiconductor transistor 112 effectively represents a current source 113.

Figure 2A:
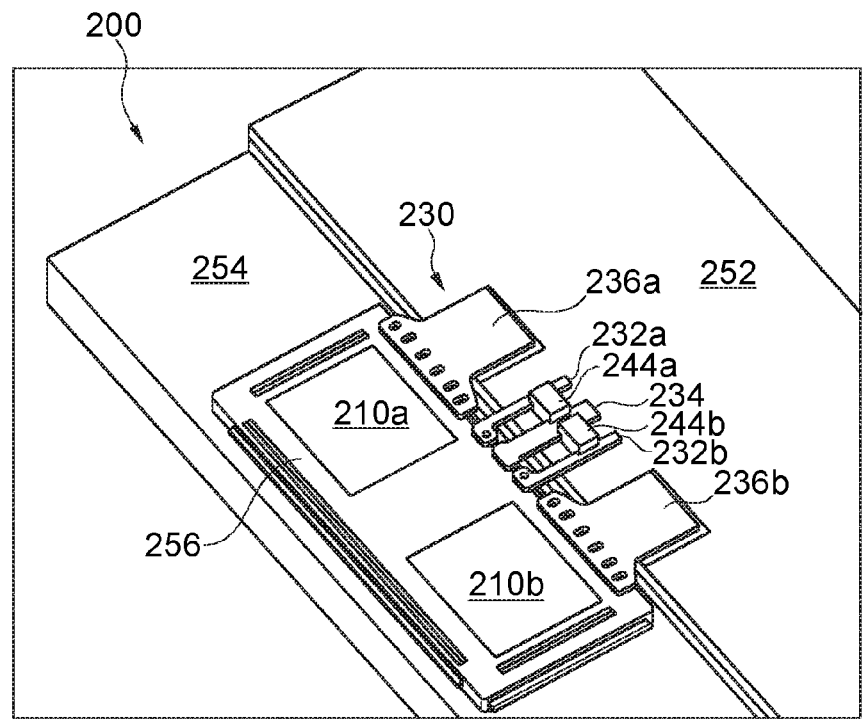
FIGS. 2a and 2b show in a perspective respectively in a plan view a packaged RF power transistor device with two active dies each comprising a semiconductor transistor.
Figure 2B:
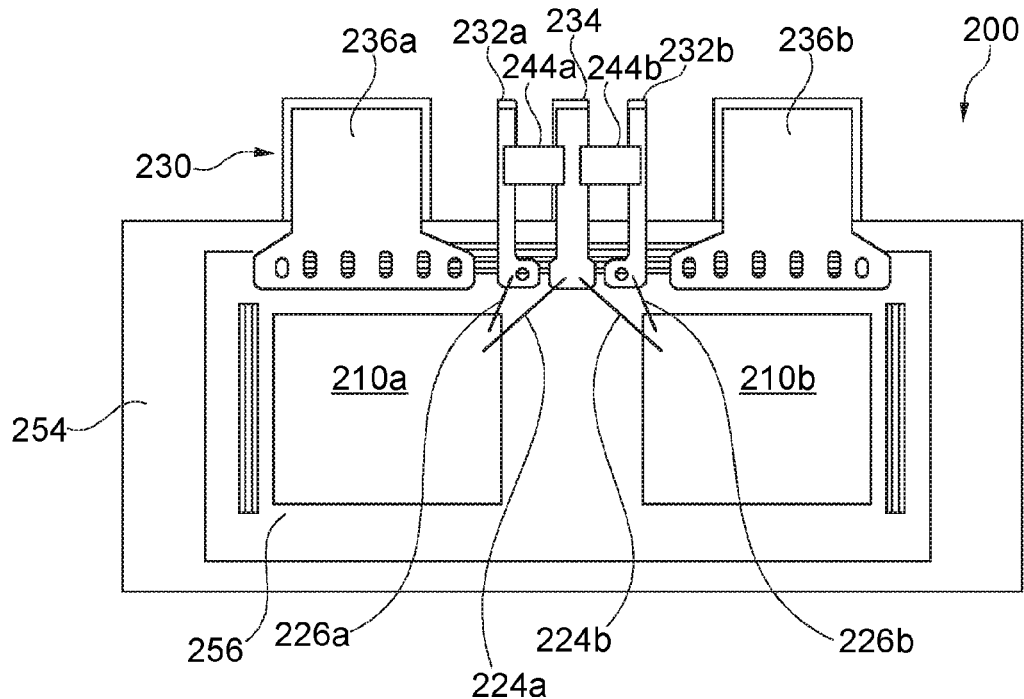

FIGS. 2a and 2b show in a perspective respectively in a plan view a packaged RF power transistor device 200. In accordance with the embodiment shown in FIG. 1, the packaged RF power transistor device 200 comprises a die 210a which is mounted to a component carrier. A printed circuit board 252 is mounted on the component carrier. The component carrier comprises a flange 256 providing a basis for the die 210a and a metal block 254 providing a basis for the flange 256 and the printed circuit board 252.

In accordance with the embodiment shown in FIG. 1, the die 210a includes a semiconductor transistor which for the sake of clarity is not depicted in FIGS. 2a and 2b.

The packaged RF power transistor device 200 comprises a lead configuration 230. According to the embodiment described here the lead configuration 230 comprises a video lead 234, a ground lead 232a and a further ground lead 232b. The video lead 234 is located in the middle between the ground lead 232a and the further ground lead 232b. The lead configuration 230 further comprises a RF output lead 236a and a further RF output lead 236b. The die 210a is connected via a non depicted bondwire to the RF output lead 236a. All leads are arranged at the same height with respect to or above an upper surface of the metal block 254.

As can be seen from FIGS. 2a and 2b, a video band decoupling capacitor 244a is connected between the ground lead 232a and the video lead 234, Further, a further video band decoupling capacitor 244b is connected between the further ground lead 232b and the video lead 234.

According to the embodiment described here the packaged RF power transistor device 200 comprises a further die 210b, which is also mounted to the flange 256 and which is located adjacent to the die 210a. The further die 210b, which carries a further semiconductor transistor, and a corresponding circuitry can be used in a not illustrated RF PA for one and the same amplifier stage or for different amplifier stages.

The further die 210b is electrically connected via a further bondwire 224b to the video lead 224b and via a further bondwire 226b to the further ground lead 232b.

Since both dies 210a and 210b each comprise a semiconductor transistor, which is an active semiconductor component, the dies 210a and 210b can be called active dies.

Figure 3:
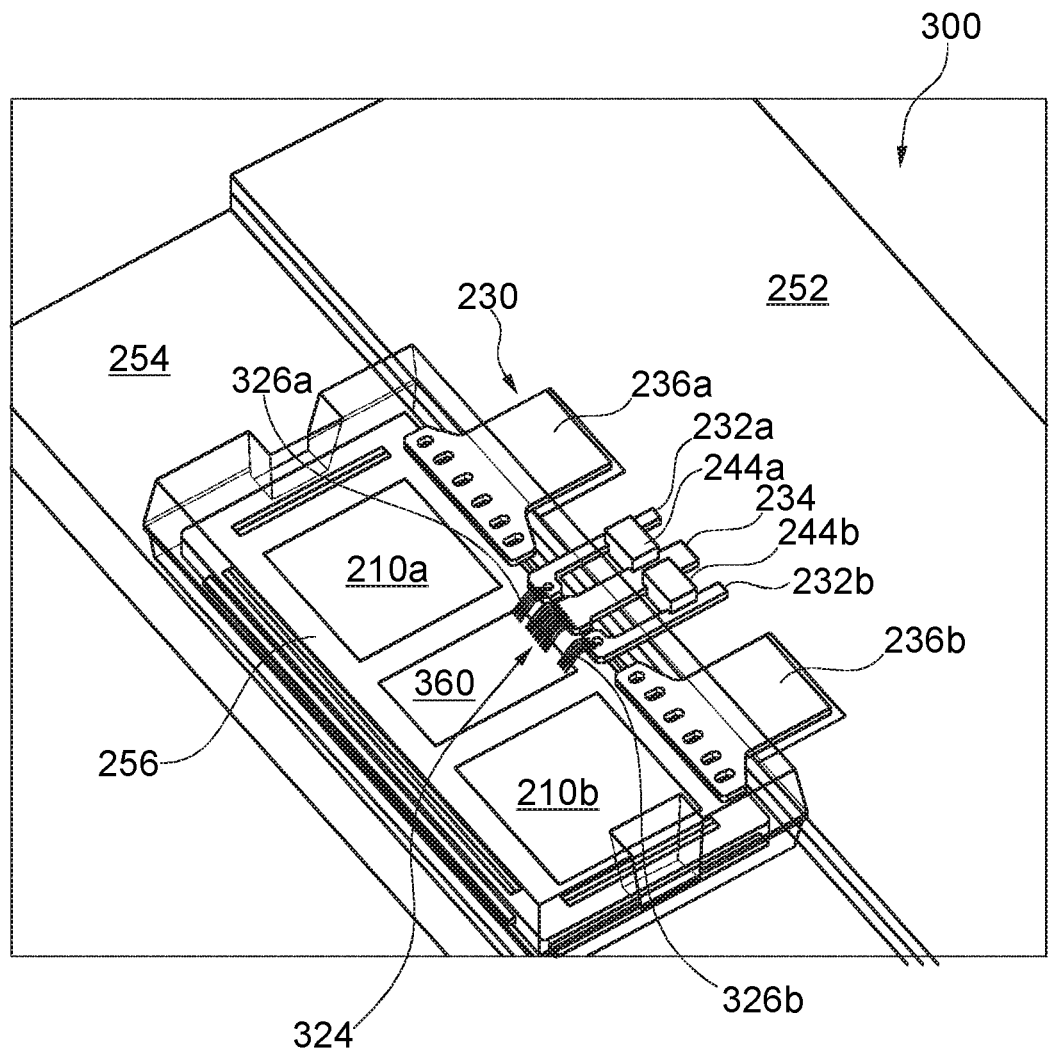
FIG. 3 shows in a perspective view a packaged RF power transistor device (a) with two active dies each comprising a semiconductor transistor and (b) with one passive die arranged between the two active dies.

FIG. 3 shows in a perspective view a packaged RF power transistor device 300. With respect to the component carrier (i.e. the metal block 254 and the flange 256) and the lead configuration 230 the packaged RF power transistor device 300 comprises the same design as the packaged RF power transistor device 200 shown in the FIGS. 2a and 2b. The packaged RF power transistor device 300 differs from the packaged RF power transistor device 200 in that in between the two (active) dies 210a and 210b there is provided a passive die 360. By contrast to the active dies 210a and 210b the passive die 360 comprises no active electronic components such as a transistor.

As has already been mentioned above, the passive die 360 is used to provide in an easy and reliable manner an electric contact between the active semiconductor dies 210a and 210b and bondwires 324 being assigned to the video lead 234 and the active semiconductor dies 210a and 210b and bondwires 326a respectively bondwires 326b being assigned to the ground lead 232a respectively to the further ground lead 232b.

According to the embodiment described here several not depicted metal tracks or conductor paths are formed on the passive die 360. The geometry of the metal tracks or conductor paths is chosen in such a manner that the impedance of the metal tracks or conductor paths exhibit a (parasitic) inductance and/or capacitance which contributes to an overall output impedance of the packaged RF power transistor device 300, which overall output impedance is very small. As has already been mentioned above, this improves e.g. operational bandwidth of the packaged RF power transistor device 300.

Figure 4A:
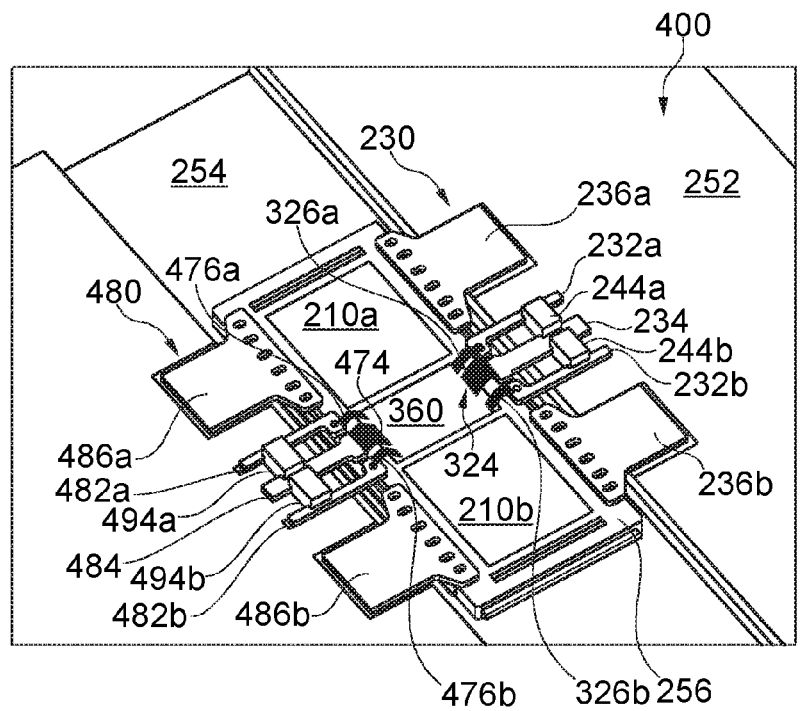
FIGS. 4a and 4b show in a perspective respectively in a plan view a packaged RF power transistor device comprising (a) two active dies each comprising a semiconductor transistor and one passive die arranged between the two active dies and (b) two lead configurations each with a ground lead, two output leads and two video leads, wherein the two lead configurations are arranged at two opposite lateral sides of the packaged RF power transistor device.
Figure 4B:
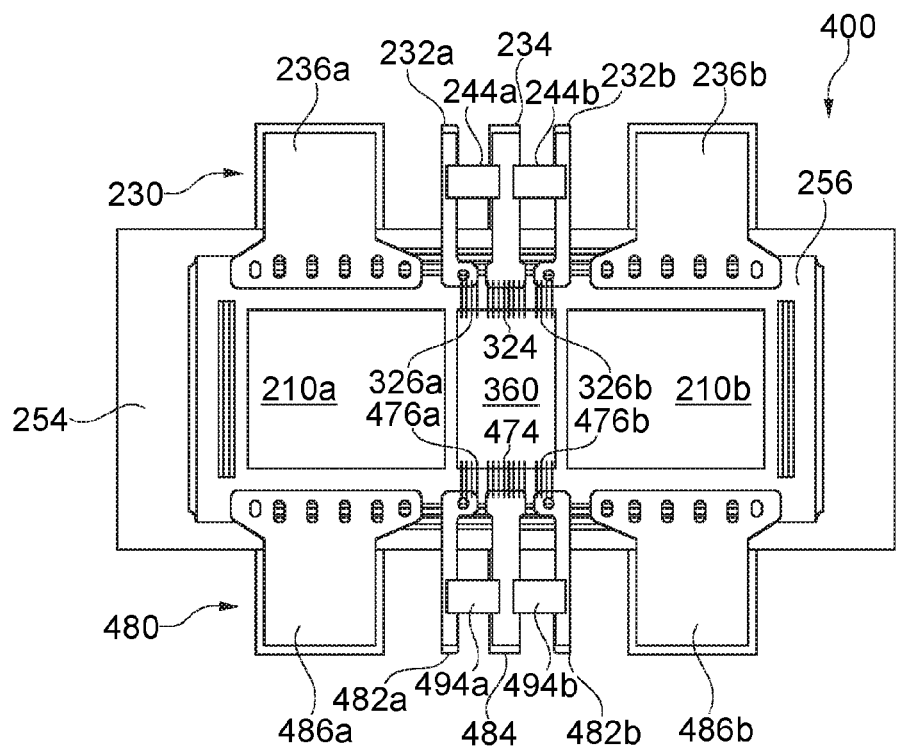

FIGS. 4a and 4b show in a perspective respectively in a plan view a packaged RF power transistor device 400. With respect to (a) the component carrier (i.e. the metal block 254 and the flange 256), (b) the lead configuration 230, (c) the two active semiconductor dies 210a, 210b, and (d) the one passive die 360 the packaged RF power transistor device 400 comprises the same design as the packaged RF power transistor device 300 shown in FIG. 3.

The packaged RF power transistor device 400 differs from the packaged RF power transistor device 300 in that there is provided an additional lead configuration 480, which is arranged at the opposite lateral side as compared to the lateral side of the lead configuration 230. The additional lead configuration 480 does not lead to a different circuitry of the electric components of the packaged RF power transistor device 400 but to additional possibilities to contact the packaged RF power transistor device 400 to the "outside world".

As can be seen from FIG. 4b, in accordance with the lead configuration 230 the additional lead configuration 480 comprises an additional ground lead 482a, an additional further ground lead 482b, an additional video lead 484. An additional video band decoupling capacitor 494a is connected between the additional ground lead 482a and the additional video lead 484. An additional further video band decoupling capacitor 494b is connected between the additional further ground lead 482b and the additional video lead 484. In FIGS. 4a and 4b there are further depicted an RF input lead 486a and a further RF input lead 486b, which are assigned to a standard (package) of an RF power transistor.

Descriptive speaking, with respect to the embodiments shown in FIGS. 2a/2b and 3, the duplication part of the lead configuration 230 includes the video lead 234 (284) and the associated ground leads 232a/232b (482a/482b).

Further, additional bondwires 474 connect the passive die 360 with the additional video lead 484. Additional bondwires 476a connect the passive die 360 with the additional ground lead 482a. Additional bondwires 476b connect the passive die 360 with the additional further ground lead 482b.

According to the embodiment described here the separation between the RF output lead 236a and the further RF output lead 236b (in a horizontal direction of FIG. 4) is approximately 8 mm. Further, the width of the RF output lead 236a respectively the further RF output lead 236b is approximately 3.5 mm. The same dimensions may apply to the additional lead configuration 480.

Descriptive speaking, by adding a second lead configuration 480 at the other lateral side of the packaged RF power transistor device 400 the parasitic (output) inductance of the whole device 400 can be reduced. Further, more video band decoupling capacitors 494a, 494b can be added. These capacitors 494a, 494b can have different values than the video band decoupling capacitors 244a, 244b and can form a wideband decoupling structure.

Figure 5A:
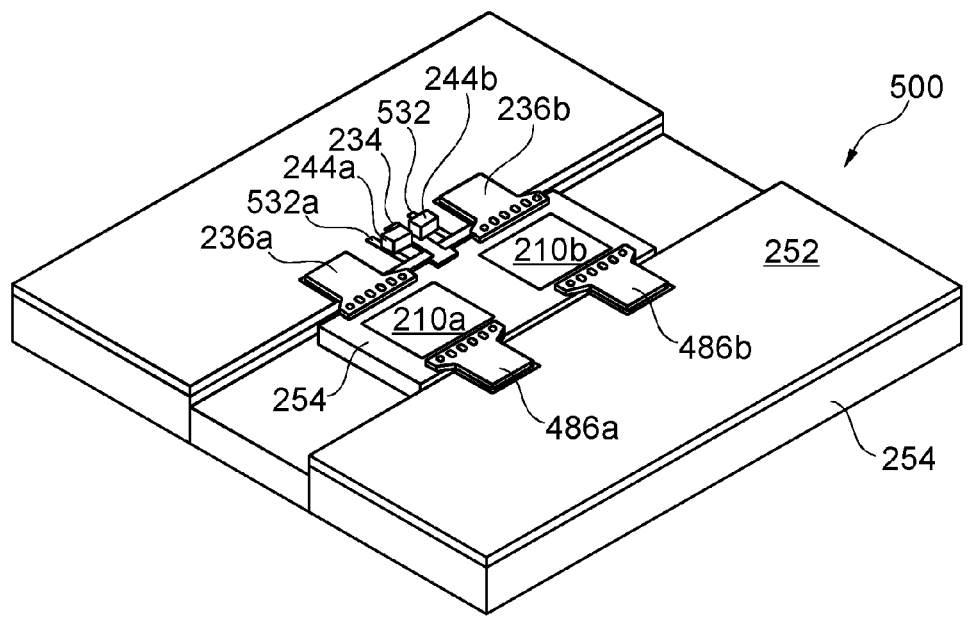
FIGS. 5a and 5b show in a perspective respectively in a plan view a packaged RF power transistor device comprising two ground connections which with respect to a reference plane being spanned by a bottom surface of the component carrier are arranged at a lower height level than the video lead.
Figure 5B:
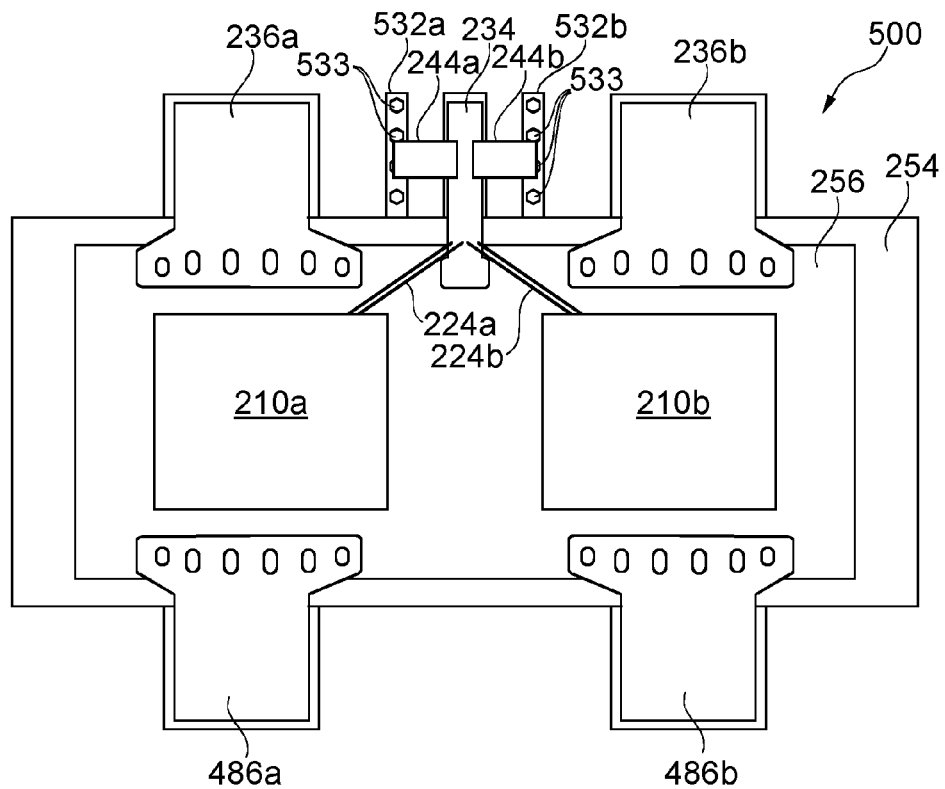

FIGS. 5a and 5b show in a perspective respectively in a plan view a packaged RF power transistor device 500 according to a further embodiment of the invention. With respect to (a) the component carrier (i.e. the metal block 254 and the flange 256, (b) the video lead 234, (c) the two video band decoupling capacitors 244a and 244b, (d) the two active semiconductor dies 210a, 210b, and (e) the two RF input leads 486a and 486b the packaged RF power transistor device 500 has the same design as the packaged RF power transistor device 400 shown in FIG. 4. By contrast to the device 400, the packaged RF power transistor device 500 does not comprise additional ground leads and an additional video lead being arranged between the two RF input leads 486a and 486b. Further, the design of the packaged RF power transistor device 500 does not comprise a passive die being arranged between the two active semiconductor dies 210a and 210b. Due to the missing passive die the contacting of the two active semiconductor dies 210a and 210b is accomplished by two (pairs of) bond wires 224a and 224b (compare the contacting within the packaged RF power transistor device 200 shown in FIG. 2b).

By contrast to all packaged RF power transistor devices 200, 300 and 400 described above the packaged RF power transistor device 500 comprises ground connections 532a and 532b, which with respect to a reference plane being spanned by a bottom surface of the component carrier are arranged at a lower height level than the video lead 234. Specifically, the bottom ground connection 532a and the further bottom ground connection 532b are arranged at a bottom side of the package such that they can be directly connected to the printed circuit board 252. Typically, the ground connection is realized by means of vias through the printed circuit board 252 to a ground potential at the backside of the printed circuit board 252.

In the embodiment shown in FIGS. 5a and 5b a contact to a ground path of the two active semiconductor dies 210a and 210b is accomplished via the backside of the package through the metal block 254.

Figure 6:
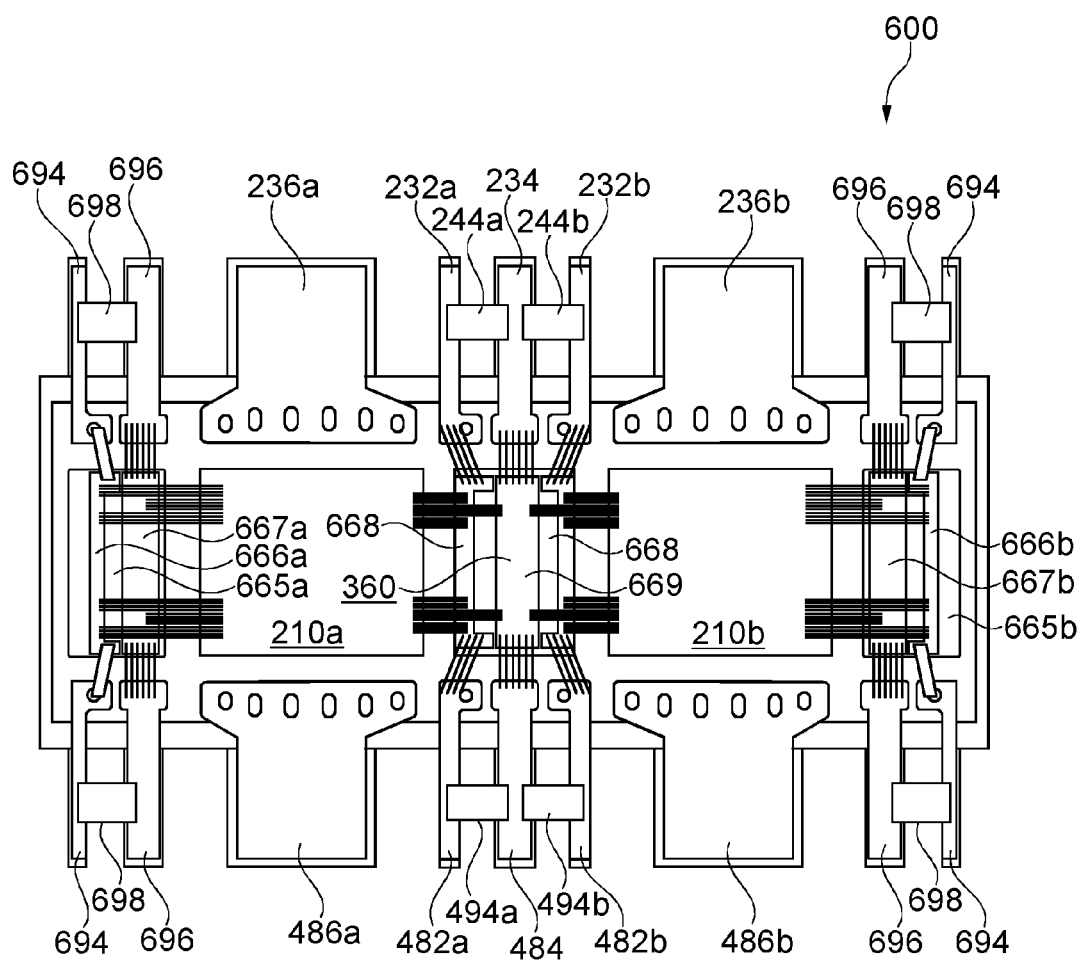
FIG. 6 shows in a perspective view a packaged RF power transistor device which comprises supplemental ground leads and supplemental video leads which are arranged at corners of the package of the RF power transistor device.

FIG. 6 shows in a perspective view a packaged RF power transistor device 600 according to a further embodiment of the invention. Apart from the structural design at two lateral border areas the design of the packaged RF power transistor device 600 is the same as the design of the packaged RF power transistor device 400 shown in FIGS. 4a and 4b.

As can be seen from FIG. 6, in addition to the elements of the device 400 the packaged RF power transistor device 600 comprises at its left lateral border area (a) one supplemental passive die 665a, two supplemental video leads 696, two supplemental ground leads 694, and two supplemental video band decoupling capacitors 698. A ground conductor path 666a and bond wires (depicted but not denominated with a reference numeral) are used to connect the supplementary ground leads 694 to the active semiconductor die 210a. A video signal conductor path 667a and bond wires (depicted but not denominated with a reference numeral) are used to connect the supplementary video leads 694 to the active semiconductor die 210a.

In accordance thereto, at its left lateral border area the packaged RF power transistor device 600 comprises (a) one supplemental passive die 665b, two supplemental video leads 696, two supplemental ground leads 694, and two supplemental video band decoupling capacitors 698. A ground conductor path 666b and bond wires (depicted but not denominated with a reference numeral) are used to connect the supplementary ground leads 694 to the further active semiconductor die 210b. A video signal conductor path 667b and bond wires (depicted but not denominated with a reference numeral) are used to connect the supplementary video leads 694 to the further active semiconductor die 210b.

It is mentioned that in FIG. 6 the central passive die 360 is shown in more detail than the passive die 360 shown in FIGS. 3, 4a and 4b. As can be seen from FIG. 6, the central passive die 360 comprises two ground conductor paths 668 which are used, together with bond wires (depicted but not denominated with reference numerals) to connect the central passive die 360 (a) to the ground leads 232a respectively 232b and to the additional ground leads 482a respectively 482b and (b) to the active semiconductor die 210a. Further, the central passive die 360 comprises a video signal conductor paths 669 which is used, together with bond wires (depicted but not denominated with reference numerals) to connect the central passive die 360 (a) to the video lead 234 respectively the additional video lead 484 and (b) to the active semiconductor die 210a.

It is explicitly pointed out that the embodiments elucidated above are only exemplary for a much higher number of embodiments which for the sake of conciseness are not shown in this document but which are in accordance with basic idea of the present invention. Specifically, different design features of different embodiments can be combined.

In the following there will be described some possible modifications, which are, together with a high number of other modifications, in accordance with the present invention:

(I) A video lead is paired only with one ground lead and not with two ground leads taking the video lead in the middle.

(II) The video lead and ground lead positions are swapped. This means that the ground lead is sitting in the middle while the two video leads are sitting at both sides.

(III) More than one decoupling capacitors can be connected between a video lead and a neighboring ground lead. Thereby, the capacitance between the video lead and a neighboring ground lead can be easily increased.

(IV) All designs can be realized with a central passive die or without a central passive die.

Compared to prior art packaged RF power transistor device the packaged RF power transistor devices 100, 200, 300, 400, 500, and 600 may provide inter alia the following advantages:

(A) Two sections of short bondwires and an on-die transmission line gives a lower output inductance than one section with long bondwires. This holds for the packaged RF power transistor devices 200, 300, and 400.

(B) A passive die being located in the middle between two active dies can be realized by means of a big capacitor (e.g. a deep trench capacitor—DTC). Such a capacitor may form an extra filtering on the video band. This holds for the packaged RF power transistor devices 300 and 400.

(C) The passive structures (e.g. transmission line, capacitor, etc.) can be introduced on the middle passive die. These passive structures can help to further optimize the video bandwidth performance. This holds for the packaged RF power transistor devices 300 and 400.

(D) A connection from the video leads at the other side of the package becomes possible. This holds for the packaged RF power transistor devices 400.

(E) In several embodiments, the video leads and the ground leads are located in the middle of the package. The RF input/output leads, therefore, see the open space at one side. This facilities the design of a low impedance matching line, which is quite often used in the high power PA design. By contrast thereto, a conventional package with video leads has the video leads at one and the same side. These video leads block the space for matching lines and introduce a lot of difficulties in PA design.

(F) In several embodiments, the ground leads and the associated bondwires are placed in the middle. This configuration fundamentally improves the isolation between two dies in the package. The isolation between two dies is a key parameter in some applications such as Doherty power amplifier.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

REFERENCE NUMERALS 100 packaged RF power transistor device
110 die
112 semiconductor transistor
112d drain
112g gate
112s source
112ds parasitic drain-source capacitance
112gs parasitic gate-source capacitance
113 current source
120 package
122 resonance circuit
122a (tuning) inductor
122b (tuning) capacitor
124 parasitic inductance of bondwire
126 parasitic inductance of bondwire
130 lead configuration
134 video lead
136 RF output lead
144 video band decoupling capacitor
200 packaged RF power transistor device
210a die
210b further die
224a bondwire
224b further bondwire
226a bondwire
226b further bondwire
230 lead configuration
232a ground lead
232b further ground lead
234 video lead
236a RF output lead
236b further RF output lead
244a video band decoupling capacitor
244b further video band decoupling capacitor
252 printed circuit board
254 metal block
256 flange
300 packaged RF power transistor device
324 bondwires
326a bondwires
326b bondwires
360 passive die
400 packaged RF power transistor device
474 additional bondwires
476a additional bondwires
476b additional bondwires
480 additional lead configuration
482a additional ground lead
482b additional further ground lead
484 additional video lead
486a RF input lead
486b further RF input lead
494a additional video band decoupling capacitor
494b additional further video band decoupling capacitor
500 packaged RF power transistor device
532a bottom ground connections
532b further bottom ground connections
533 vias
600 packaged RF power transistor device
665a supplemental passive die
665b supplemental passive die
666a ground conductor path
666b ground conductor path
667a video signal conductor path
667b video signal conductor path
668 ground conductor path
669 video signal conductor path
694 supplemental ground leads
696 supplemental video lead
698 supplemental video band decoupling capacitor

The invention claimed is:

1. A packaged Radio Frequency power transistor device, in particular for use in a power amplifier operating in the frequency range from DC up to 3 GHz, the packaged Radio Frequency power transistor device comprising:
a component carrier,
a die comprising a semiconductor transistor having a source, a gate and a drain, wherein the die is mounted at the component carrier,
a ground lead extending from the component carrier and electrically connected to the source,
an output lead extending from the component carrier and electrically connected to the drain,
a resonance circuit being electrically inserted between the drain and the ground lead,
a video lead extending from the component carrier and electrically connected to the resonance circuit, wherein the video lead is configured for being connected to a first contact of a decoupling capacitor, wherein
the ground lead is configured for being connected to a second contact of the decoupling capacitor, and wherein the ground lead and the video lead are spatially arranged next to each other, and
a further ground lead extending from the component carrier, wherein the video lead is arranged in between the ground lead and the further ground lead.

2. The packaged Radio Frequency power transistor device as set forth in claim 1, wherein the component carrier comprises
a flange providing a support for the die, and
a metal block providing a support for the flange.

3. The packaged Radio Frequency power transistor device as set forth in claim 1, wherein
the semiconductor transistor being comprised within the die is a Metal Oxide Semiconductor device.

4. The packaged Radio Frequency power transistor device as set forth in claim 1, further comprising
a further video lead, wherein the ground lead is arranged between the video lead and the further video lead.

5. The packaged Radio Frequency power transistor device as set forth in claim 1, wherein the die comprises
an active semiconductor die, and a passive die, wherein the active semiconductor die and the passive die are spatially separated from each other.

6. The packaged Radio Frequency power transistor device as set forth in claim 5, further comprising
a further active semiconductor die comprising a further power transistor device having a further source, a further gate and a further drain, wherein the further active semiconductor die is mounted at the component carrier.

7. The packaged Radio Frequency power transistor device as set forth in claim 6, wherein
the passive die is located in between the active semiconductor die and the further active semiconductor die.

8. The packaged Radio Frequency power transistor device as set forth in claim 5, wherein
the active semiconductor die is electrically connected to the video lead by means of at least a first bondwire and
the further active semiconductor die is electrically connected to the video lead by means of a second bondwire.

9. A Radio Frequency power amplifier comprising
a printed circuit board, and
a packaged Radio Frequency power transistor device as set forth in claim 1, wherein the packaged Radio Frequency power transistor device is mounted at the printed circuit board.

10. A packaged Radio Frequency power transistor device, in particular for use in a power amplifier operating in the frequency range from DC up to 3 GHz, the packaged Radio Frequency power transistor device comprising:
a component carrier,
a die comprising a semiconductor transistor having a source, a gate and a drain, wherein the die is mounted at the component carrier,
a ground lead extending from the component carrier and electrically connected to the source,
an output lead extending from the component carrier and electrically connected to the drain,
a resonance circuit being electrically inserted between the drain and the ground lead,
a video lead extending from the component carrier and electrically connected to the resonance circuit, wherein the video lead is configured for being connected to a first contact of a decoupling capacitor, wherein
the ground lead is configured for being connected to a second contact of the decoupling capacitor, and wherein the ground lead and the video lead are spatially arranged next to each other,
an additional ground lead being electrically connected to the ground lead, and
an additional video lead being electrically connected to the video lead, wherein with respect to a first lateral side of the package of the Radio Frequency power transistor device at which first lateral side the ground lead and the video lead are lead through the package to the outside of the package the additional ground lead and the additional video lead are arranged at a second lateral side of the package, wherein the second lateral side is opposite to the first lateral side.

11. The packaged Radio Frequency power transistor device as set forth in claim 10, wherein
the additional ground lead or the additional video lead are arranged at least approximately at the same height level as the video lead respectively as the ground lead.

12. The packaged Radio Frequency power transistor device as set forth in claim 10, wherein the component carrier comprises
a flange providing a support for the die, and
a metal block providing a support for the flange.

13. The packaged Radio Frequency power transistor device as set forth in claim 10, wherein
the semiconductor transistor being comprised within the die is a Metal Oxide Semiconductor device.

14. The packaged Radio Frequency power transistor device as set forth in claim 10, further comprising
a further video lead, wherein the ground lead is arranged between the video lead and the further video lead.

15. The packaged Radio Frequency power transistor device as set forth in claim 10, wherein the die comprises
an active semiconductor die, and
a passive die, wherein the active semiconductor die and the passive die are spatially separated from each other.

16. The packaged Radio Frequency power transistor device as set forth in claim 15, further comprising
a further active semiconductor die comprising a further power transistor device having a further source, a further gate and a further drain, wherein the further active semiconductor die is mounted at the component carrier.

17. The packaged Radio Frequency power transistor device as set forth in claim 16, wherein
the passive die is located in between the active semiconductor die and the further active semiconductor die.

18. The packaged Radio Frequency power transistor device as set forth in claim 15, wherein
the active semiconductor die is electrically connected to the video lead by means of at least a first bondwire and
the further active semiconductor die is electrically connected to the video lead by means of a second bondwire.

19. A Radio Frequency power amplifier comprising
a printed circuit board, and
a packaged Radio Frequency power transistor device as set forth in claim 10, wherein the packaged Radio Frequency power transistor device is mounted at the printed circuit board.

* * * * *